(12) United States Patent
Cesura et al.

(10) Patent No.: US 7,671,769 B2
(45) Date of Patent: Mar. 2, 2010

(54) MULTISTAGE ANALOG/DIGITAL CONVERTER AND METHOD FOR CALIBRATING SAID CONVERTER

(75) Inventors: Giovanni Antonio Cesura, Cremona (IT); Roberto Giampiero Massolini, Giussago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/198,709

(22) Filed: Aug. 26, 2008

(65) Prior Publication Data

US 2009/0102688 A1 Apr. 23, 2009

Related U.S. Application Data

(63) Continuation-in-part of application No. PCT/IT2006/000117, filed on Feb. 27, 2006.

(51) Int. Cl.
*H03M 1/06* (2006.01)
(52) U.S. Cl. .................. 341/118; 341/120; 341/121; 341/155; 341/161; 341/163
(58) Field of Classification Search ......... 341/118–122, 341/155, 161, 163
See application file for complete search history.

(56) References Cited

U.S. PATENT DOCUMENTS

| | | | | |
|---|---|---|---|---|
| 5,668,549 A | * | 9/1997 | Opris et al. | 341/118 |
| 6,127,958 A | * | 10/2000 | Chang et al. | 341/155 |
| 6,456,223 B1 | * | 9/2002 | Yu et al. | 341/161 |
| 6,486,807 B2 | * | 11/2002 | Jonsson | 341/120 |
| 6,515,611 B1 | * | 2/2003 | Fetterman et al. | 341/161 |
| 6,822,601 B1 | * | 11/2004 | Liu et al. | 341/161 |
| 6,967,603 B1 | * | 11/2005 | Lin | 341/120 |
| 7,035,756 B2 | * | 4/2006 | Maloberti et al. | 702/126 |
| 7,142,138 B2 | * | 11/2006 | Chen et al. | 341/120 |
| 7,221,299 B2 | * | 5/2007 | Bjornsen | 341/131 |
| 7,289,055 B2 | * | 10/2007 | Kobayashi et al. | 341/161 |
| 7,352,306 B2 | * | 4/2008 | Xu | 341/118 |

(Continued)

OTHER PUBLICATIONS

Blecker et al., "Digital Background Calibration of an Algorithmic Analog-to-Digital Converter Using a Simplified Queue," IEEE Journal of Solid-State Circuits, 38(6):1059-1062, Jun. 2003.

(Continued)

*Primary Examiner*—Linh V Nguyen
(74) *Attorney, Agent, or Firm*—Lisa K. Jorgenson; Robert Iannucci; Seed IP Law Group PLLC

(57) ABSTRACT

A multistage analog/digital converter for converting in multistep cycles an input signal into respective digital codes, each cycle step resolving at least one bit of a respective digital code. The converter includes: a sampling circuit inputting the signal and outputting a first sequence of analog samples; a generation block of a pseudorandom sequence of samples; a summing node, such as to input the first sequence and the pseudorandom sequence, obtaining in output a second sequence of analog samples including non-pseudorandom samples; a converter having a controllable digital gain receiving the second sequence and outputting bits of the digital codes; a feedback loop with a loop gain and including an analog amplifier; a digital calibration block to match the digital gain to the loop gain and including a prediction block to produce a digital estimation of said input signal starting from the bits resulting from converting the non-pseudorandom samples.

22 Claims, 3 Drawing Sheets

U.S. PATENT DOCUMENTS

2002/0041248 A1* 4/2002 Galton .................. 341/156

OTHER PUBLICATIONS

Li et al., "Background Calibration Techniques for Multistage Pipelined ADCs With Digital Redundancy," IEEE Transactions on Circuits and Systems-II: Analog and Digital Signal Processing, 50(9):531-538, Sep. 2003.

Moon et al., "Background Digital Calibration Techniques for Pipelined ADCs," IEE Transactions on Circuits and Systems-II: Analog and Digital Signal Processing, 44(2):102-109, Feb. 1997.

* cited by examiner

MULTISTAGE ANALOG/DIGITAL CONVERTER AND METHOD FOR CALIBRATING SAID CONVERTER

CROSS-REFERENCE TO RELATED APPLICATION

This application is a continuation-in-part of PCT Patent Application No. PCT/IT2006/000117, filed Feb. 27, 2006, now pending, which application is incorporated herein by reference in its entirety.

BACKGROUND

1. Technical Field

The present invention relates to the technical field of conversion of analog signals into digital signals and in particular relates to an analog/digital converter and a method for calibrating said converter.

2. Description of the Related Art

In many electronic apparatuses, the need is felt to convert analog signals into digital signals. A significant example of this type of apparatus is given by the digital terminals of mobile communication. In these applications, the requirements for low consumption, low voltage and high performance create particularly severe conditions for the design of the integrated circuits which make up the electronic system of the terminal.

The possibility of producing said integrated circuits with an ever-increasing level of integration (e.g. pure CMOS technology) leaves a greater area available on the chip which can be used for implementing digital signal processing (DSP) techniques often directed at improving the performance of analog components/circuits, for example used to compensate for imprecision inherently introduced by analog components/circuits.

This trend is also present in the sector of analog/digital converters, in particular in the sector of multistage converters, for which correction methods have been developed, more commonly known as calibration methods, intended to correct errors present in the conversion result due to the non-ideality of analog components, such as capacitors or operational amplifiers, present in the converter. Said non-ideality is, for example, attributable to the capacitor mismatch of the sampling circuits present at the converter input and to the limited gain-bandwidth product of the real operational amplifiers.

Among the calibration methods which belong to the prior art, there is a first type of method which makes it possible to perform a foreground calibration, in other words calibration performed when the analog signal to be converted is not applied to the converter input. These methods have the advantage that they have only a limited circuit complexity and the advantage that they guarantee an accurate conversion result. However, the foreground calibration methods have the intrinsic drawback that they cannot be used when the analog signal to be converted is applied to the converter input. In some applications however continuous calibration during signal conversion is necessary.

To overcome this drawback, a second type of calibration method has been developed. In particular, these methods use correlation methods and they are able to operate during conversion of the analog signal without interfering with the normal operation of the analog/digital converter.

These methods normally work by adding, to the analog samples of the signal to be converted, respective samples of a pseudorandom noise sequence, so that the error to be corrected is modulated by said sequence. The digital output of the converter is processed by means of correlation operations so as to extract the modulated information with the aim to improve the performance of the converter. It has been empirically proved that between the convergence time $t_{conv}$ (time to reach half LSB precision) of said correction methods and the resolution N in number of bits of the converter, there exists a relation of the type:

$$t_{conv} = 2^{2 \cdot N} T_s$$

where $T_s$ is the sampling period.

From the above relation it can be seen that, for example, by using one of the above-described background correction methods of the prior art in a cyclic converter with a resolution of 13 bits and operating at a frequency of 5 MS/s (megasymbols per second), a convergence time of approximately 30 seconds is obtained. This extended convergence time makes the background calibration methods of the known art unsuitable for use in numerous applications.

BRIEF SUMMARY

One embodiment is an analog/digital converter having a correction (i.e. calibration) system which is such as to provide shorter convergence times than the convergence times of the systems or methods of the prior art and which, at the same time, has a limited circuit complexity.

One embodiment is an analog/digital converter as defined in the attached claim 1. Preferred embodiments are defined in the dependent claims.

One embodiment is a method for calibrating a multistage analog/digital converter, as defined in the attached claim 11.

BRIEF DESCRIPTION OF THE SEVERAL VIEWS OF THE DRAWINGS

Further features and advantages of an analog/digital converter will become more apparent from the following detailed description of an exemplary but non-limiting embodiment thereof, as illustrated in the accompanying drawings, in which.

DETAILED DESCRIPTION

In the Figures, equal or similar elements are indicated with the same reference numbers.

Figure 1:
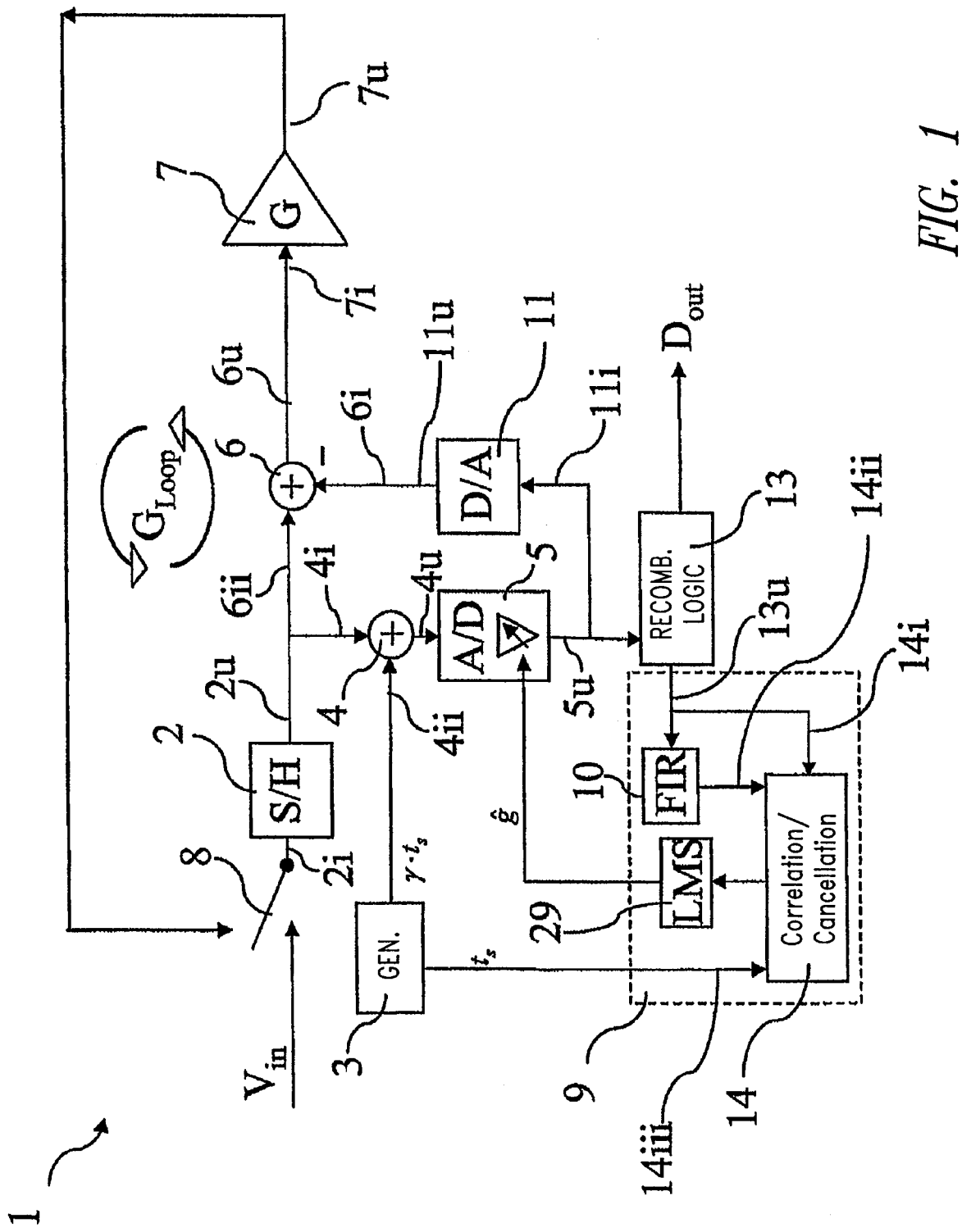
FIG. 1 shows a block diagram of an exemplary and particularly preferred embodiment of an analog/digital converter.

FIG. 1 shows an embodiment of a multistage analog/digital converter 1, suitable to convert an input analog signal $V_{in}$ into an output digital signal $D_{out}$. In particular, the analog/digital converter 1 is such as to convert analog samples of the input signal $V_{in}$ into respective digital codes $D_{out}$, each formed by N bit, where N is an integer which represents the resolution of the converter 1. In a preferred embodiment, N is equal to 16, but evidently the teachings herein can be extended to analog/digital converters with a different resolution.

For exemplary and non-limiting purposes, this description will refer in particular to a cyclic multistage analog/digital converter 1, usually called algorithmic analog/digital converter. However, it should be noted that the teachings herein can easily be extended by the skilled in the art also to different types of multistage analog/digital converters, for example to the so-called pipeline multistage analog/digital converters.

As used herein, a multistage analog/digital converter means a converter which operates so as to carry out each conversion cycle in plural steps. In one embodiment, one or more different bits are resolved at each step (i.e. at least one bit) of a respective output digital code $D_{out}$, which in practice represents a sample of an output digital signal $D_{out}$ and is equivalent to the representation in the digital domain, obtained by means of the converter 1, of a sample of the input analog signal $V_{in}$. In particular, conversion at a particular step is commonly based on a residue resulting from partial conversion at the preceding step. Conversion cycle means all the operations, or steps, carried out to resolve all the N bits of the output digital code $D_{out}$. In particular, only for exemplary but non-limiting purposes, this description will refer to the case in which the multistage analog/digital converter 1 resolves a single bit of the code $D_{out}$ at each step, so that each conversion cycle is formed by N steps, where N is the converter resolution.

With reference to FIG. 1, the multistage analog/digital converter 1 includes a sampling circuit 2 with an input 2$i$ and an output 2$u$. The input 2$i$ makes it possible for the sampling circuit 2 to receive the analog signal $V_{in}$ to be converted. The sampling circuit 2 operates in such a way as to provide, through the output 2$u$, analog samples of the input signal $V_{in}$ forming a sequence of samples. Preferably, the sampling circuit 2 includes a sample and hold circuit with switched capacitors.

A change-over switch 8, connected to the input 2$i$ of the sampling circuit 2 makes it possible to selectively apply the analog signal $V_{in}$ to the input 2$i$ of the sampling circuit 2. In practice, in a cyclic converter like the analog/digit converter 1 illustrated in FIG. 1, the analog signal $V_{in}$ to be converted is applied to the sampling circuit 2 only at the beginning of each conversion cycle, in order to output from the sampling circuit 2 a corresponding analog sample which will be converted into a respective digital code $D_{out}$ during the different steps forming said conversion cycle. At the beginning of a successive new cycle, the change-over switch 8 makes it possible to again apply the analog signal $V_{in}$ to the sampling circuit 2 for execution of the new conversion cycle. In practice, a sequence $V_{in}^*$ formed by analog samples of the input analog signal $V_{in}$ will be present at the output 2$u$ of the sampling circuit 2, each of said samples being arranged near the initial part of a respective conversion cycle.

The analog/digital converter 1 further includes a summing node 4, with a first input 4$i$ connected to the output 2$u$ of the sampling circuit 2, and with a second input 4$ii$ suitable to receive a pseudorandom sequence of analog samples $\gamma \cdot t_s$ in output from a generation block 3 of signals included in the converter 1. The symbol $\gamma$ represents a gain factor, or scaling factor, which makes it possible to scale the amplitude of the samples in the pseudorandom sequence $t_s$ and can, for example, be controlled by means of the generation block 3. Since $\gamma$ represents only one scaling factor, both the sequence $t_s$ and the sequence $\gamma \cdot t_s$ will be referred to hereunder with the expression pseudorandom.

In reply to the samples received at the two inputs 4$i$ and 4$ii$, the summing node 4 provides, at an output 4$u$, a new sequence of analog samples $V_{in}^+$ which in practice is a given sum, sample by sample, of the two sequences of samples $V_{in}^*$ and $\gamma \cdot t_s$ in input to the summing node 4. Advantageously, the sum sequence $V_{in}^+ = \gamma \cdot t_s + V_{in}^*$ includes a plurality of samples where the contribution of the pseudorandom sequence $\gamma \cdot t_s$ is absent. In practice, said samples coincide with the corresponding samples of the sequence $V_{in}^*$. The advantage of said alternative will be explained in detail hereunder.

In a particularly advantageous embodiment, the above is obtained, for example, by setting the period of the sequence $\gamma \cdot t_s$ in such a way that it is equal to an integer multiple (according to a factor $N_{skip}$) of the period of the sequence of samples $V_{in}^*$. In this way, a sum sequence $V_{in}^+$ will be present in output from the summing node 4, so that in each group of $N_{skip}$ samples (which is a whole number greater than 1, for example between 10 and 200) of the sum sequence $V_{in}^+$, a sample including the contribution of the pseudorandom sequence $\gamma \cdot t_s$ will be present. This particular way of producing the pseudorandom sequence $\gamma \cdot t_s$ is advantageous because in this case the generation block 3 is easier to produce since it "works" at a lower frequency than the sampling frequency of the converter 1. In an alternative embodiment, it is possible to generate a pseudorandom sequence at a full frequency and then decimate the samples of said frequency to be summed to the sampled analog signal $V_{in}^*$.

With reference to FIG. 1, the analog/digital converter 1 includes analog/digital conversion means 5 which in practice represent partial conversion means, connected to the output 4$u$ of the summing node 4 and having a digital gain $\hat{g}$ which can be controlled by means of a calibration block 9, included in the converter 1. In a preferred embodiment, said conversion means 5 include an analog/digital converter 5 with low resolution (in practice, the resolution of said converter determines the number of bits of the digital code $D_{out}$ resolved at every step of a conversion cycle). Preferably, the analog/digital converter 5, which in a multistage converter 1 is usually called "sub-ADC", is a flash converter with multiple thresholds. More particularly, in the specific example described, the converter 5 uses two thresholds and has a resolution of one bit, therefore, a converter usually defined by experts in the sector "1.5 bit sub-ADC". This type of converter, hereinafter referred to as sub-ADC converter 5, is generally known to the skilled man in the art and therefore, will not be described further.

As shown in the diagram in FIG. 1, the analog/digital converter 1 includes a logic recombining block 13, connected to the output 4$u$ of the sub-ADC converter 5. The logic recombining block 13 is also known to the skilled in the art and in practice can be imagined as a block which includes a register and which is such as to receive and reorganize, at each step of a conversion cycle, the bits in output from the sub-ADC 5 so as to provide the digital code $D_{out}$ in the register and at the end of each conversion cycle.

The analog/digital converter 1 further includes an digital/analog converter 11 having an input 11$i$ connected to the output 5$u$ of the sub-ADC 5 and having an output 11$u$ connected to the input 6$i$ of a further summing node 6 comprised in the analog/digital converter 1. The further summing node 6 further includes a second input 6$ii$ connected to the output 2$u$ of the sampling means 2 and is such as to provide, at an output 6$u$, a signal given by the difference between the signal in output from the sampling circuit 2 and the signal in output from the analog/digital converter 11. As is known to the skilled in the art, said difference signal is an analog signal (in the form of a sequence of samples) which represents, at every step, the residue of the partial conversion carried out in said step by the sub-ADC 5.

As shown in FIG. 1, the analog/digital converter 1 further includes analog amplification means 7, preferably including at least an operational amplifier 7. In FIG. 1, G indicates the overall gain of said amplification means 7. Said amplification means 7 are such as to receive, at an input 7$i$, the difference signal output from the summing node 6 so as to provide, at an output 6u, an amplified difference signal.

As is known to the skilled in the art, if a cyclic converter 1 is such as to resolve at each step a single bit of the output digital code, the gain G of the amplification means 7 is ideally exactly equal to 2, but in practice it is often a number approximately equal to 2. If, however, two bits of the output digital code are resolved at each step of a conversion cycle, the gain G of the amplification means 7 is ideally exactly equal to 4, but in practice it is a number approximately equal to 4.

The output 6u of the amplification means 7 can be connected to the input 2i of the sampling means by means of the change-over switch 8, for performing the steps of each conversion cycle after the first step. It should be noted that, in practice, the analog/digital converter 1 in FIG. 1:

- at the first step of each conversion cycle, is such as to have a configuration where the analog signal to be converted $V_{in}$ is applied to the input 2i of the sampling circuit 2 and where the output 6u of the amplification means 7 is disconnected from said input 2i,
- in the following steps of each conversion cycle, is such as to have a second configuration where the output 7u of the amplification means 7 is connected to the input 2i of the sampling circuit 2 and where the analog signal to be converted $V_{in}$ is not applied to the input 2i of the sampling circuit 2.

It should be observed that in this second configuration, the analog/digital converter 1 includes a feedback loop including the sampling circuit 2 and the amplification means 7.

It is known that, due to the inherent non-ideality of the analog components and devices, the effective loop gain $G_{Loop}$, which in the embodiment described should theoretically be equal to the ideal gain of the amplification means 7, in this case equal to 2, does not have exactly said value. The inherent non-ideality is substantially due both to the mismatch of the sampling circuit 2 capacitors and to the fact that the gain-bandwidth of the amplification means 7 is limited.

For this reason, the calibration block 9 modifies the digital gain $\hat{g}$ in order to reduce or cancel any conversion errors due to the above-described non-ideality. More in particular, the objective of the calibration block 9 is to modify the digital gain $\hat{g}$ so that it is as near as possible to the loop gain $G_{Loop}$.

Figure 2:
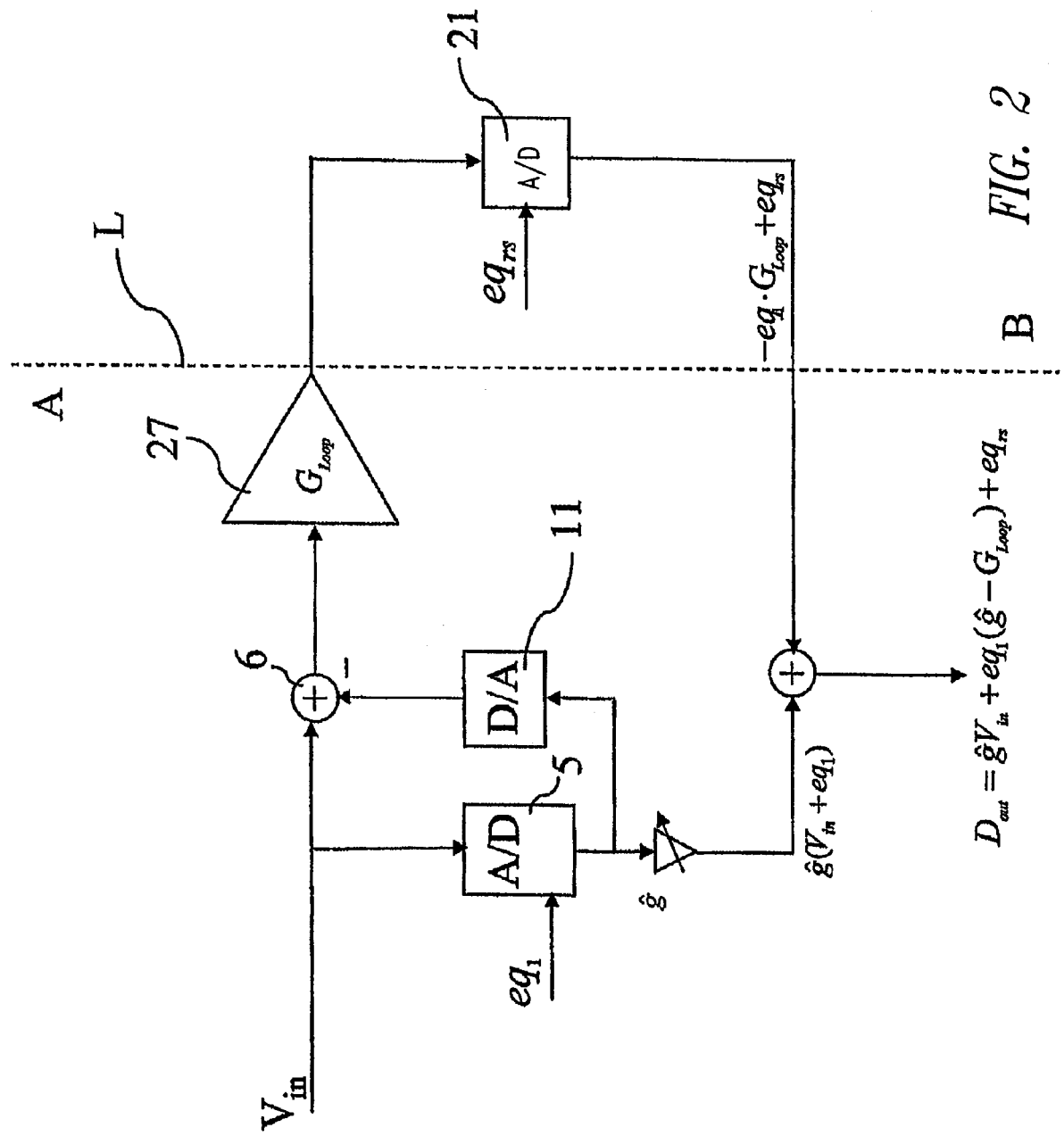
FIG. 2 schematically shows a model useful for calculating the quantization error introduced by a cyclic analog/digital converter.

Before describing more in detail the calibration block 9 and its behavior, it is useful to illustrate how said non-ideality influences the operation of the analog/digital converter 1, using a simplified model shown schematically in FIG. 2, which makes it possible to analytically evaluate the relation between the error introduced into the conversion and the mismatch between the digital gain $\hat{g}$ and the loop gain $G_{Loop}$.

The simplified model in FIG. 2 illustrates a cyclic converter in its extended version. Moreover, in the drawing in FIG. 2 the cyclic converter is shown without the part relative to the calibration of the digital gain $\hat{g}$. The non-identity of the feedback loop has been summarized in the model by means of an amplification block 27 having a gain equal to $G_{Loop}$ which, in practice, corresponds to the effective gain of the feedback loop of the converter 1 in FIG. 1. A dashed line L divides the model in FIG. 2 into two parts, part A and part B. Part A represents the model of the cyclic converter in operation during the first conversion step of the signal $V_{in}$, while part B relates to the successive steps. The steps following the first step have been modeled simply by means of an ideal analog/digital converter 21 which introduces a residual quantization error $eq_{rs}$. At the first step, the sub-ADC introduces a quantization error $eq_1$.

On the basis of the model in FIG. 2, the digital output $D_{out}$ of the cyclic converter, at the end of the conversion cycle, can be given as follows:

$$D_{out} = \hat{g}V_{in} + eq_1(\hat{g} - G_{Loop}) + eq_{rs}. \quad (1)$$

As can be seen from the above formula (1), when there is mismatch between the digital gain $\hat{g}$ and the loop gain $G_{Loop}$, a fraction of the quantization noise $eq_1$ introduced by the sub-ADC 5 at the first step, filters into the output so lowering the performance of the cyclic converter. This phenomenon is called "quantization noise leakage". In particular, this noise leakage influences performance in terms of signal/noise ratio at the output of the cyclic converter; moreover, this is noise which, far from being white noise, is strongly correlated to the input $V_{in}$.

Advantageously, by means of the calibration block 9 in FIG. 1, it is possible to reduce the above-described phenomenon by matching the digital gain $\hat{g}$ to the loop gain $G_{Loop}$.

Figure 3:
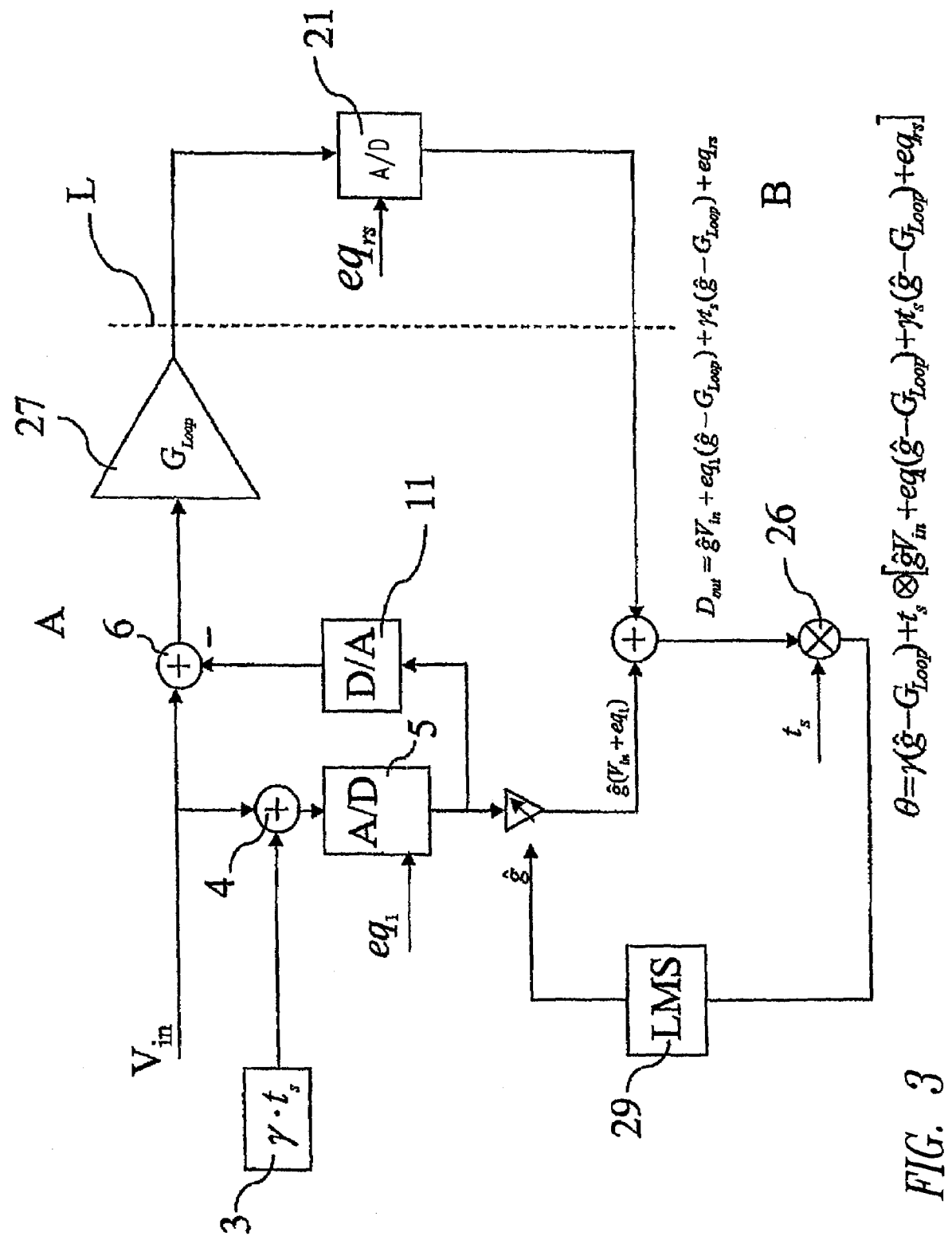
FIG. 3 schematically shows a model which, compared to the model in FIG. 2, has been perfected with the addition of a digital gain calibration system.

In FIG. 3, the model in FIG. 2, used for calculating the error present on the output digital signal $D_{out}$, has been perfected with the addition of a part relative to the calibration system by correlation of the digital gain $\hat{g}$.

In particular, calibration of the gain $\hat{g}$ involves injection of a pseudorandom sequence $\gamma \cdot t_s$ at the same point where the quantization noise $eq_1$ is introduced, similarly to what happens in the converter illustrated in FIG. 1. In this way, the transfer function of said pseudorandom sequence at output is the same as the quantization noise present at the converter output.

It should be observed that in this case the output signal can be expressed as:

$$D_{out} = \hat{g}V_{in} + eq_1(\hat{g} - G_{Loop}) + \gamma t_s(\hat{g} - G_{Loop}) + eq_{rs}. \quad (2)$$

On the basis of the formula (2) it is possible to see how a further noise contribution, proportional to the pseudorandom sequence $\gamma \cdot t_s$ and to the difference between the digital gain and loop gain, is present at output.

From this it ensues that, by carrying out a correlation product by means of a multiplier 26 between the output $D_{out}$ and the pseudorandom sequence $t_s$, it is possible to extract the gain mismatch $\theta$, where:

$$\theta = \gamma(\hat{g} - G_{Loop}) + t_s \otimes [\hat{g}V_{in} + eq_1(\hat{g} - G_{Loop}) + eq_{rs}]. \quad (3)$$

In the above equation (3) the symbol $\otimes$ represents the correlation product. In this description, the expression residual correlation noise $\theta_{err}$ will indicate the second term which appears in the above equation (3) where the gain mismatch $\theta$ is expressed in analytical form. In practice, the residual correlation noise is given by:

$$\theta_{err} = t_s \otimes [\hat{g}V_{in} + eq_1(\hat{g} - G_{Loop}) + eq_{rs}]. \quad (4)$$

From the formula (4) it can be seen that if $V_{in}$, $eq_1$ and $eq_{rs}$ are uncorrelated from the sequence $t_s$, the residual correlation noise $\theta_{err}$ is practically nil. In this case, by minimizing the gain mismatch error $\theta$, for example by means of a least mean square (LMS) algorithm, implemented in FIG. 3 by means of the loop LMS minimization block 29, it is possible to converge (see equation 3) the digital gain $\hat{g}$ to the loop gain $G_{Loop}$. In this way, it is possible (see formula 2) to cancel from the digital output $D_{out}$ both the noise term due to the quantization noise $eq_1$ and the noise term due to the sequence $t_s$.

However, in practice this does not take place since the residual correlation term $\theta_{err}$ is not totally negligible and this limits the efficiency of the calibration method. In a real situation, in order to bring to zero the residual correlation $\theta_{err}$, one could increase the length of the pseudorandom sequence $\gamma \cdot t_s$ and/or increase the integration step of the LMS loop minimization block 29. However, both these expedients have a negative and significant influence on the performance in terms of the calibration method convergence.

It has been observed, however, that the dominant contribution in the expression (4) of residual correlation $\theta_{err}$ is the one proportional to the input signal $V_{in}$, since said signal is a full scale signal and is much greater than the remaining term $eq_1(\hat{g}-G_{Loop})+eq_{rs}$.

For this reason, advantageously, the calibration block 9 of the analog/digital converter 1 (FIG. 1), is such as to implement (by means of the correlation and cancellation block 14, included in the calibration block 9) an algorithm for the digital cancellation of the input signal $V_{in}$ in the process to minimize the gain mismatch $\theta$ (equation 3). This makes it possible to keep the residual correlation noise term $\theta_{err}$ very low, permitting, for example, the use of a high integration step in the minimization block LMS 29 (FIG. 3) and/or the use of a shorter pseudorandom sequence. This advantageously determines a high convergence rate.

Since advantageously, as explained more in detail before, both input signal samples containing the contribution of the pseudorandom sequence $\gamma \cdot t_s$ and samples not containing said contribution are present in the sample sequence $V_{in}^+$ in output from the summing node 4, it is possible to carry out, in the calibration block 9, a prediction (i.e. an estimation) of the input signal $V_{in}$, starting from the digital codes $D_{out}$, corresponding to (i.e. resulting from the conversion of) samples of the sequence $V_{in}^+$ in output from the summing node 4 which do not contain the contribution of the pseudorandom sequence $\gamma \cdot t_s$. It should be observed that, in practice, cancellation of the input signal $V_{in}$ in the calibration block 9 can be carried out starting from the bits output from the same sub-ADC 4, i.e. without requiring the onerous addition, in the analog/digital converter 1, of a further analog/digital converter on an additional path which is such as to avoid the summing node 4 where the pseudorandom sequence $\gamma \cdot t_s$ is injected in the input signal $V_{in}$.

In a particularly advantageous embodiment, the prediction of the input signal $V_{in}$ is performed by means of an interpolation block 10, provided in the analog/digital converter 1. Said block 10 operates in such a way as to perform interpolation of the output digital codes $D_{out}$ resulting from the conversion of the samples of the sequence $V_{in}^+$ output from the summing node 4 where the component of the pseudorandom sequence $\gamma \cdot t_s$ is absent. Preferably, but not limited to, said interpolation is a polynomial interpolation, more preferably a non-linear Lagrange interpolation. In alternative embodiments, equivalent interpolation methods and known to the skilled in the art may be implemented in the block 10 instead of the non-linear Lagrange interpolation.

In a particularly advantageous embodiment, the interpolation block 10 includes a FIR filter suitable to implement interpolation useful for prediction of the input signal $V_{in}$.

Preferably, the interpolation performed by the block 10 operates so as to obtain a digital estimation $\hat{D}_{out}$ of a sample of the input signal $V_{in}$ (corresponding to a sample of the sequence $V_{in}^+$ output from the summing node 4 where the component of the pseudorandom sequence $\gamma \cdot t_s$ is present), by using the results of the conversion of the $N_{skip}-1$ samples which precede said sample and of the $N_{skip}-1$ samples which follow said sample. On the basis of the above, in these $2(N_{skip}-1)$ samples (and, therefore, in the corresponding digital codes) the contribution of the pseudorandom sequence $\gamma \cdot t_s$ is not included.

Once said estimation has been obtained, the cancellation and correlation block 14, included in the calibration block 9, is such as to cancel the input signal (or rather its contribution) from the correlation error estimation for the subsequent minimization of said error (minimization block 29), in order to match the digital gain $\hat{g}$ to the loop gain $G_{Loop}$.

Hereunder a particularly preferred embodiment will be described of the cancellation method performed by the calibration block 9 and in particular by the cancellation and calibration block 14.

From formula 2, it can be seen that the result of the conversion $D_{out}$ of a sample of the sum sequence $V_{in}^+$ output from the summing node 4 where the pseudorandom sequence $\gamma \cdot t_s$ is present, can be expressed as:

$$D_{out} = \hat{g} V_{in} + eq_1(\hat{g}-G_{Loop}) + \gamma t_s(\hat{g}-G_{Loop}) + eq_{rs}. \quad (5)$$

The prediction block 10 produces, starting from the result of conversion of the $2(N_{skip}-1)$ samples which precede and follow said sample and which do not include the contribution of the pseudorandom sequence $\gamma \cdot t_s$, an estimation $\hat{D}_{out}$ of the code given in formula (5), which can be expressed as:

$$\hat{D}_{out} = \hat{g} V_{in} + eq_1(\hat{g}-G_{Loop}) + eq_{rs} + Pr\,ed_{err} \quad (6)$$

where $Pr\,ed_{err}$ represents the error present in the estimation.

The cancellation and correlation block 14 (as shown symbolically by the presence of connections 14i and 14ii in the drawing in FIG. 1), advantageously operates by calculating the difference in the digital samples given in formulae (5) and (6), in practice calculating the difference:

$$D_{out}-\hat{D}_{out} = \gamma t_s(\hat{g}-G_{Loop}) + Pr\,ed_{err} \quad (7)$$

to then calculate a correlation product (as shown symbolically by the connection 14iii) between said difference (7) and the pseudorandom sequence $t_s$ so as to obtain an estimated error of gain mismatch $\theta_{new}$ given by:

$$\theta_{new} = t_s \otimes (D_{out}-\hat{D}_{out}) = \gamma(\hat{g}-G_{Loop}) + t_s \otimes Pr\,ed_{err}. \quad (8)$$

As can be seen from the formula (8), the error $\theta_{new}$, unlike the mismatch error $\theta$ given in formula (3), includes a residual correlation noise term $\theta_{err\_new} = t_s \otimes Pr\,ed_{err}$ which, unlike the term $\theta_{err}$ (formula 4), no longer contains a term proportional to the input signal $V_{in}$ and which, therefore, has much smaller power than $\theta_{err}$.

The error $\theta_{new}$ can then be minimized in a way known to the skilled in the art, by means of the minimization block 10 which, preferably but not limited to, implements a LMS loop minimization.

It should be observed that advantageously the prediction block 10 is inserted into the calibration block 9 so that it has no influence whatsoever on the digital output (block 13) of the analog/digital converter 1. In this way, even an approximate estimation of the input signal will be sufficient to have the error $\theta_{err\_new}$ much lower than the error $\theta_{err}$, further permitting simple implementation for the prediction block 10.

It is important to underline that, even if the process to estimate the gain error is effected in a down-sampled way (since the pseudorandom sequence $t_s$ is injected once every $N_{skip}$ clock cycles), the increase in the convergence rate obtained by means of cancellation of the input signal $V_{in}$ fully compensates said down-sampling, so much so that experimental results have shown that the calibration method of the converter 1 has a convergence rate even 100 times faster than the methods of the prior art.

It should also be considered that the prediction block 10 also operates in a sub-sampled fashion. In the particular embodiment where said block 10 is implemented by means of a digital FIR filter, it has been seen that said filter is very simple to produce since it was observed that, in the case where polynomial interpolation is used, the coefficients of the FIR filter tend rapidly to zero. In practice, to produce a cyclic analog/digital converter (including a 1.5 bit sub-ADC) having a speed of 15 MS/s (mega-symbols per second), a FIR filter with 19 taps is sufficient which, having to operate in down-sampled mode, can be produced by means of a lookup table to store the filter coefficients, a multiplier and an accumulator.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multistage analog/digital converter for converting, using conversion cycles each with plural steps, analog samples of an input signal into respective digital codes formed of bits, each cycle step resolving at least one bit of a respective one of the digital codes, the converter comprising:
    a sampling circuit having an input and an output, the sampling circuit being suitable to input said input signal and to output a first sequence of analog samples;
    a generation block structured to generate and output a pseudorandom sequence of output samples;
    a first summing node, such as to input said first sequence and said pseudorandom sequence and output a second sequence of analog samples, said second sequence including non-pseudorandom samples where said pseudorandom sequence is absent;
    conversion means, having a controllable digital gain, for converting samples of the second sequence to bits of said digital codes;
    a feedback loop with a loop gain and including an analog amplifier coupled between the output and input of said sampling circuit; and
    a digital calibration block structured to match the digital gain to the loop gain, the digital calibration block including a prediction block structured to produce a digital estimation of said input signal starting from the bits produced by said conversion means from converting said non-pseudorandom samples.

2. The analog/digital converter according to claim 1, wherein said calibration block is structured to use the estimation to cancel interference due to said input signal in the matching of said digital gain to said loop gain.

3. The analog/digital converter according to claim 1, wherein said prediction block is such as to produce said estimation using an interpolation algorithm.

4. The analog/digital converter according to claim 3, wherein said algorithm is such as to implement a non-linear Lagrange interpolation.

5. The analog/digital converter according to claim 1, wherein said prediction block includes a digital FIR filter.

6. The analog/digital converter according to claim 1, wherein a respective one of the pseudorandom samples of said second sequence is present every $N_{skip}$ samples of said second sequence, where $N_{skip}$ is an integer greater than one, and where the non-pseudorandom samples to produce said estimation include the $N_{skip}-1$ samples which precede the respective pseudorandom sample and the $N_{skip}+1$ samples which follow said respective pseudorandom sample.

7. The analog/digital converter according to claim 6, wherein said calibration block is such as to update the digital gain based on said estimation once every $N_{skip}$ conversion cycles.

8. The analog/digital converter according to claim 1, wherein said feedback loop further includes a second summing node having a first input coupled to the output of said sampling circuit, a second input, and an output coupled to said amplifier, the converter further including a digital/analog converter having an output coupled to said second input of the second summing node and having an input coupled to output of said conversion means.

9. The analog/digital converter according to claim 8, wherein said feedback loop further includes a change-over switch having a first input coupled to an output of said amplifier for selectively connecting said amplifier output to the input of said sampling circuit, said change-over switch having a second input for selectively coupling said input signal to the input of said sampling circuit.

10. The analog/digital converter according to claim 9, wherein said change-over switch is such as to exclude the application of said input signal to said sampling circuit after a first step of each conversion cycle and is such as to couple the output of said amplifier to the input of said sampling circuit starting from a second step through a last step of each conversion cycle.

11. A method, comprising:
    summing a pseudorandom sequence and a first sequence of samples of an analog signal to be converted, the summing producing a second sequence of samples, said second sequence including non-pseudorandom samples where said pseudorandom sequence is absent;
    producing digital codes by converting said second sequence using an analog/digital converter stage, having a controllable digital gain, and a feedback loop having a loop gain;
    estimating, based on said digital codes, a mismatch error between said gains, said estimated error including an error contribution depending on said analog signal, said estimating including:
    producing a digital estimation of samples of said input analog signal starting from the digital codes resulting from the conversion of said non-pseudorandom samples,
    canceling said error contribution using said produced digital estimation.

12. The method according to claim 11, wherein said producing the digital estimation includes interpolating said digital codes resulting from the conversion of said non-pseudorandom samples.

13. The method according to claim 1, wherein a respective one of the pseudorandom samples of said second sequence is present every $N_{skip}$ samples of said second sequence, where $N_{skip}$ is an integer greater than one, and where the non-pseudorandom samples to produce said estimation include the $N_{skip}-1$ samples which precede the respective pseudorandom sample and the $N_{skip}+1$ samples which follow said respective pseudorandom sample.

14. The method according to claim 13, wherein the cancelling includes updating the digital gain based on said estimation once every $N_{skip}$ conversion cycles.

15. The method according to claim 11, wherein the feedback loop includes an amplifier, the method comprising:
    applying said analog signal to an input a sampling circuit during a first step of each conversion cycle;
    coupling an output of the amplifier to the input of the sampling circuit from a second step and through a last step of each conversion cycle, said input signal being decoupled from the input of said sampling circuit from the second step through the last step of each conversion cycle.

16. A multistage analog/digital converter, comprising:

a generation block structured to generate and output a pseudorandom sequence of pseudorandom samples;

a first summing node, such as to input a first sequence of analog samples and said pseudorandom sequence and output a second sequence of analog samples, said second sequence including non-pseudorandom samples where said pseudorandom sequence is absent;

a converter, having a controllable digital gain, structured to convert samples of the second sequence to bits of digital codes;

a feedback loop with a loop gain coupled to an input of the summing node; and a digital calibration block structured to match the digital gain to the loop gain, the digital calibration block including a prediction block structured to produce a digital estimation of said first sequence starting from the bits produced in converting said non-pseudorandom samples.

17. The analog/digital converter according to claim 16, wherein said calibration block is structured to use the estimation to cancel interference due to said first sequence in the matching of said digital gain to said loop gain.

18. The analog/digital converter according to claim 16, wherein a respective one of the pseudorandom samples of said second sequence is present every $N_{skip}$ samples of said second sequence, where $N_{skip}$ is an integer greater than one, and where the non-pseudorandom samples to produce said estimation include the $N_{skip}-1$ samples which precede the respective pseudorandom sample and the $N_{skip}+1$ samples which follow said respective pseudorandom sample.

19. The analog/digital converter according to claim 18, wherein said calibration block is such as to update the digital gain based on said estimation once every $N_{skip}$ conversion cycles.

20. The analog/digital converter according to claim 16, wherein said feedback loop includes:

a sampling circuit having an input and an output, the sampling circuit being suitable to input an analog input signal and to output the first sequence of analog samples;

a second summing node having a first input coupled to the output of said sampling circuit, a second input, and an output; and an amplifier coupled to the output of the second summing node, the converter further including a digital/analog converter having an output coupled to said second input of the second summing node and an input coupled to output of said converter.

21. The analog/digital converter according to claim 20, wherein said feedback loop further includes a change-over switch having a first input coupled to an output of said amplifier for selectively connecting said amplifier output to the input of said sampling circuit, said change-over switch having a second input for selectively coupling said input signal to the input of said sampling circuit.

22. The analog/digital converter according to claim 21, wherein said change-over switch is such as to exclude the application of said input signal to said sampling circuit after a first step of each conversion cycle and is such as to couple the output of said amplifier to the input of said sampling circuit starting from a second step through a last step of each conversion cycle.

* * * * *